United States Patent
Fujikawa (10) Patent No.: US 10,212,832 B2
(45) Date of Patent: Feb. 19, 2019

(54) ELECTRO-OPTICAL PANEL, ELECTRO-OPTICAL DEVICE, AND ELECTRONIC APPARATUS

(71) Applicant: SEIKO EPSON CORPORATION, Shinjuku-ku, Tokyo (JP)

(72) Inventor: Shinsuke Fujikawa, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/886,231

(22) Filed: Feb. 1, 2018

(65) Prior Publication Data

US 2018/0228037 A1 Aug. 9, 2018

(30) Foreign Application Priority Data

Feb. 6, 2017 (JP) .................... 2017-019299

(51) Int. Cl.
| | |
|---|---|
| *H01R 9/00* | (2006.01) |
| *H05K 5/00* | (2006.01) |
| *H05K 1/02* | (2006.01) |
| *H05K 1/11* | (2006.01) |

(52) U.S. Cl.
CPC ......... *H05K 5/0017* (2013.01); *H05K 1/0274* (2013.01); *H05K 1/0296* (2013.01); *H05K 1/11* (2013.01); *H05K 2201/09918* (2013.01)

(58) Field of Classification Search
CPC ...... H05K 1/0274; H05K 1/0296; H05K 1/11; H05K 2201/09918; H05K 5/0017
See application file for complete search history.

(56) References Cited

U.S. PATENT DOCUMENTS

| | | | | |
|---|---|---|---|---|
| 6,297,868 B1* | 10/2001 | Takenaka | ............ | G02F 1/13452 349/151 |
| 6,407,796 B2* | 6/2002 | Tajima | ................ | H01L 23/5387 257/E23.177 |
| 7,599,193 B2* | 10/2009 | Park | .................. | H01L 23/49838 174/254 |
| 2002/0167508 A1* | 11/2002 | Ishiyama | .............. | G02F 1/1345 345/205 |
| 2011/0122356 A1* | 5/2011 | Saimen | ................ | H05K 1/0269 349/149 |
| 2012/0236514 A1 | 9/2012 | Saimen | | |

(Continued)

FOREIGN PATENT DOCUMENTS

| | | |
|---|---|---|
| JP | 2012-194242 A | 10/2012 |
| JP | 2015-106109 A | 6/2015 |
| JP | 2017-120299 A | 7/2017 |

*Primary Examiner* — Yuriy Semenenko
(74) *Attorney, Agent, or Firm* — Oliff PLC (57) ABSTRACT

Provided is an electro-optical panel including a first area in which a circuit is formed and a first terminal area and a second terminal area that are arranged side-by-side in a Y direction when viewed from the first area. The first terminal area and the second terminal area are each provided with a terminal group including a plurality of terminals arranged in an X direction different from the Y direction, and at least one of wires from the first terminal area to the first area and from the second terminal area to the first area extends from between the first terminal area and the second terminal area and reaches the first area through an area outside of the first terminal area when viewed from a central axis of the electro-optical panel extending in the Y direction.

18 Claims, 9 Drawing Sheets

(56) References Cited

U.S. PATENT DOCUMENTS

| | | | |
|---|---|---|---|
| 2014/0240933 A1* | 8/2014 | Lee | G06F 1/1656 361/749 |
| 2014/0313439 A1* | 10/2014 | Matsumoto | G06F 3/0412 349/12 |
| 2017/0184903 A1 | 6/2017 | Fujikawa | |

* cited by examiner

ELECTRO-OPTICAL PANEL, ELECTRO-OPTICAL DEVICE, AND ELECTRONIC APPARATUS

BACKGROUND

1. Technical Field

The present invention relates to an electro-optical panel which is small in size and capable of performing a high-resolution display, an electro-optical device, and an electronic apparatus.

2. Related Art

High resolution properties and miniaturization of an electro-optical device such as a liquid crystal panel (liquid crystal light valve) usable for a liquid crystal projector are in progress. If the number of pixels is increased to realize a high resolution, since there is an increase in the number of panel terminals such as a terminal to which a signal that controls the display of each pixel is applied, it is difficult to ensure a sufficient terminal arrangement area. In addition, when the number of pixels is increased to realize a high resolution, the load of the driving circuit that drives each pixel is increased accordingly, and therefore there is a need to use an integrated circuit (IC) with a high performance to constitute the driving circuit. However, development of a high-performance IC is costly, for example, and problems of heat generation also occur. A terminal arrangement area has been ensured by adopting a configuration in which terminal groups each including a plurality of terminals are arranged on a plurality of sides of a panel (electro-optical panel) or a configuration in which the terminal groups are arranged in parallel. However, as the size of the panel continues to decrease, it may be difficult to ensure a terminal mounting area even by these countermeasures (see JP-A-2012-194242).

There is such a problem that upon driving by an IC, for example, in a state in which a chip on film (COF) on which the IC is mounted is connected to an electro-optical panel such as a liquid crystal panel, the size of a non-display area, such as a terminal group area for the COF connection and a wiring area for a power supply wire or the like, is larger than the size of a display area, and the size of the electro-optical device is increased accordingly.

SUMMARY

An advantage of some aspects of the invention is to provide a technique capable of realizing an electro-optical device which is small in size and having high-resolution and in which a driving IC can be mounted.

An electro-optical panel according to a first aspect of the invention includes a circuit area in which a circuit is formed and a first terminal area and a second terminal area that are arranged side-by-side in a first direction when viewed from the circuit area. The first terminal area and the second terminal area are each provided with a terminal group including a plurality of terminals which are arranged in a second direction different from the first direction, and at least one of wires from the first terminal area to the circuit area and from the second terminal area to the circuit area extends from between the first terminal area and the second terminal area and reaches the circuit area through an area outside of the first terminal area when viewed from a central axis of the electro-optical panel extending in the first direction.

According to the aspect, it is possible to further reduce a width of an area between the circuit area and the first terminal area than before and suppress an increase in the sizes of the electro-optical panel and the electro-optical device using the electro-optical panel.

The terminal group arranged in the first terminal area and the terminal group arranged in the second terminal area may have a common signal arrangement or different signal arrangements.

The at least one of wires extending from between the first terminal area and the second terminal area may be connected to both of the terminal arranged in the first terminal area and the terminal arranged in the second terminal area, or may be connected to any one of the terminal arranged in the first terminal area and the terminal arranged in the second terminal area. For example, if the terminal group arranged in the first terminal area and the terminal group arranged in the second terminal area include terminals given the same role, the at least one of wires may be connected to both the terminals arranged in the first terminal area and arranged in the second terminal area, and if the terminal group arranged in the first terminal area and the terminal group arranged in the second terminal area does not include terminals given the same role, the at least one of wires may be connected to any one of the terminals arranged in the first terminal area and arranged in the second terminal area.

Preferably the at least one of wires extending from between the first terminal area and the second terminal area is connected to a power supply terminal, and the at least one of wires extending from between the first terminal area and the second terminal area is a power supply wire that is connected to the power supply terminal, and the number of common power supply terminals to which a common potential is applied among power supply terminals included in the terminal group arranged in the first terminal area and the power supply terminals included in the terminal group arranged in the second terminal area may be larger than the number of power supply terminals to which another potential is applied. According to such an aspect, it is possible to suppress an increase in the size of the electro-optical device using the electro-optical panel while increasing resistance to fault of the common power supply.

More preferably, the common power supply wire connected to a common power supply terminal may have a portion having a wire width larger than another power supply wire connected to another power supply terminal. According to such an aspect, the low resistance of the common power supply wire can be realized.

An electro-optical panel according to a second aspect of the invention includes a circuit area in which a circuit is formed, and a first terminal area that is arranged in a first direction when viewed from the circuit area. The first terminal area is provided with a terminal group including a plurality of terminals arranged in a second direction different from the first direction, at least one of wires from the first terminal area to the circuit area extends from the first terminal area and reaches the circuit area through an area outside of the first terminal area when viewed from a central axis of the electro-optical panel extending in the first direction, and an alignment mark which is a mark when a wiring substrate of an anisotropic conductive film (ACF) is adhered to the terminal group of the first terminal area is arranged as an outlined pattern in a wiring layer. According to such an aspect, it is possible to arrange the alignment mark while increasing the wire width of the power supply wire from the first terminal area to the first area.

The electro-optical device according to a third aspect of the invention includes the electro-optical panel according to any of the above-described aspects. According to the aspect, the electro-optical device including the electro-optical panel according to any of the aspects is provided.

The electronic apparatus according to a fourth aspect of the invention includes the electro-optical device according to the above-described aspect. According to the aspect, the electronic apparatus including the electro-optical device according to the above-described aspect is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described below with reference to the accompanying drawings.

First Embodiment

Figure 1:
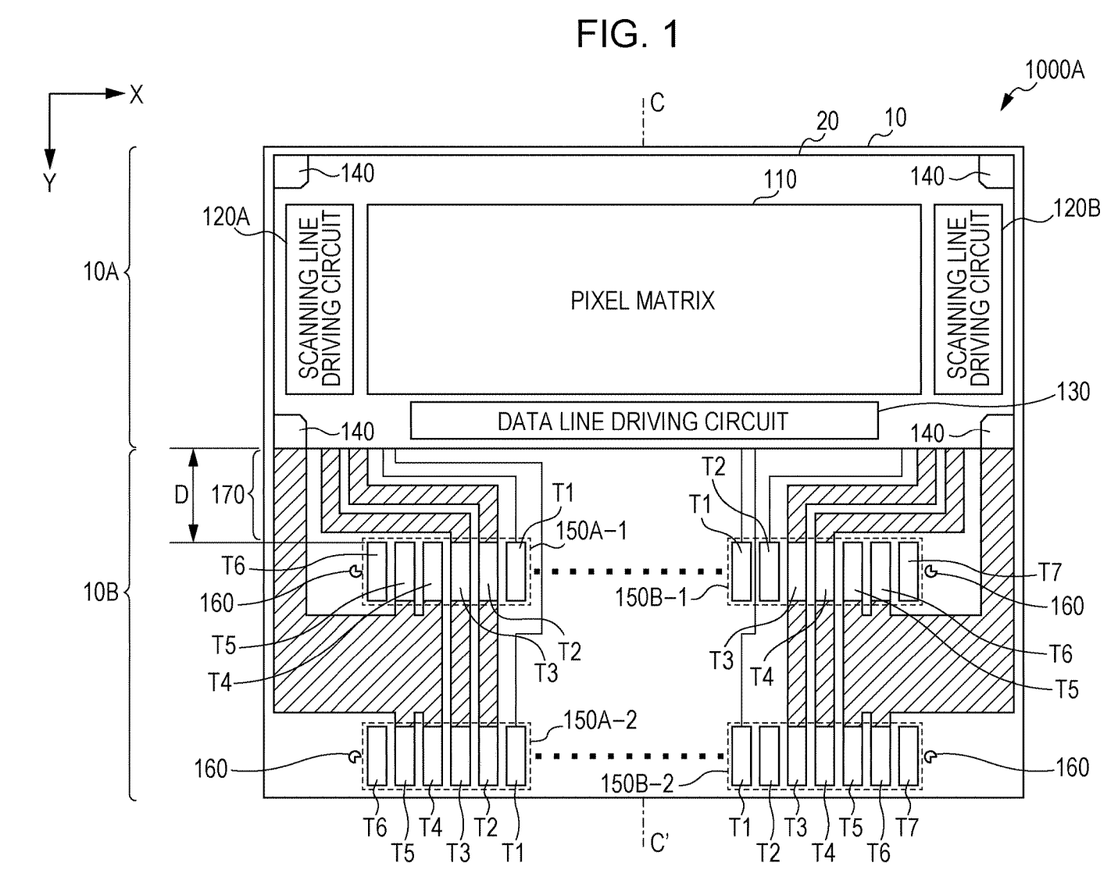
FIG. 1 is a plan view illustrating a configuration of an electro-optical panel according to a first embodiment of the invention.

FIG. 1 is a plan view of an electro-optical panel 1000A according to an embodiment of the invention. The electro-optical panel 1000A is an active matrix-type liquid crystal display device for a display unit of an electronic apparatus which is small in size such as a projection-type projector. The electro-optical panel 1000A includes an element substrate 10 (a semiconductor substrate on which a semiconductor is formed, or simply a substrate) and a counter substrate 20. The element substrate 10 has a rectangular planar shape, and a surface of the element substrate 10 is divided into a first area 10A and a second area 10B each of which has a rectangular planar shape. The counter substrate 20 has a rectangular planar shape slightly smaller than the first area 10A and is mounted on the first area 10A. Hereinafter, as illustrated in FIG. 1, a transverse direction (first direction) of the first area 10A is referred to as the Y direction, and a longitudinal direction (second direction) is referred to as the X direction.

The first area 10A is a circuit area which includes a pixel matrix 110 and a circuit including scanning line driving circuits 120A and 120B. As illustrated in FIG. 1, upper and lower conducting points 140 which are in electrical contact with counter electrodes on the counter substrate 20 are formed in the vicinity of four corners of the first area 10A. A gap between the pixel matrix 110 and the counter substrate 20 is filled with an electro-optical material (not illustrated) such as a liquid crystal. The pixel matrix 110 is formed by arranging, in a matrix form, pixel electrodes (not illustrated) and thin film transistor (TFT) elements (not illustrated) in which one of three terminals is connected to a pixel electrode. The other two terminals of the three terminals of the TFT element are connected to a scanning line (not illustrated) and a data line (not illustrated) which are arranged to surround the pixel electrodes in a grid shape.

In FIG. 1, each scanning line extends in the X direction and is connected to the scanning line driving circuit 120A and the scanning line driving circuit 120B. The roles of the scanning line driving circuit 120A and the scanning line driving circuit 120B may be shared such that odd-numbered scanning lines are connected to the scanning line driving circuit 120A and even-numbered scanning lines are connected to the scanning line driving circuit 120B when each scanning line is numbered first, second, or the like in the Y direction, which is a direction from the first area 10A toward the second area 10B. In FIG. 1, each data line extends in the Y direction and is connected to the data line driving circuit 130. Since the data line driving circuit 130 and the scanning line driving circuits 120A and 120B do not differ substantially from those of existing active matrix-type liquid crystal display devices, a description thereof is not repeated.

Four terminal areas 150A-1, 150A-2, 150B-1, and 150B-2 are provided in the second area 10B. Each terminal area is referred to as an area in which a terminal group, which is a connection destination of the COF, is arranged. Each of the terminal areas 150A-1, 150A-2, 150B-1, and 150B-2 has one terminal group which is a connection destination of the COF. The terminal area 150A-1 is line-symmetrical with the terminal area 150B-1, and the terminal area 150A-2 is line-symmetrical with the terminal area 150B-2, with a central axis of the element substrate 10 extending in the Y direction, indicated by an alternating long and short dashed line C-C' as a symmetry axis. Hereinafter, the terminal areas 150A-1 and 150A-2 will mainly be described in consideration of the symmetry. It should be noted that the terminal areas 150A-1, 150A-2, 150B-1, and 150B-2 are areas conceptually divided and illustrated for explanation of the present application. Typically, terminals are arranged continuously from the terminal area 150A-1 to the terminal area 150B-1 to be connection destinations of a first COF. Similarly, terminals are arranged continuously from the terminal area 150A-2 to the terminal area 150B-2 to be connection destinations of a second COF.

As illustrated in FIG. 1, the terminal area 150A-1 and the terminal area 150A-2 are arranged side-by-side in the Y direction in the second area 10B. More specifically, the terminal area 150A-1, which is a first terminal area, is arranged to be spaced from the first area 10A to enable mounting of the COF in the Y direction. Such spacing is required in accordance with the width of ACF adhered thereto, the clearance to be ensured for a compression head, or the like. The terminal area 150A-2, which is a second terminal area, is arranged to be spaced from the terminal area 150A-1 to enable mounting of the COF in the Y direction. As illustrated in FIG. 1, an alignment mark 160 is disposed on the element substrate 10 by forming a wiring layer pattern or the like on the element substrate 10. The alignment mark 160 is positioned outside of an end portion of the terminal area 150A-1 extending in the Y direction of a side opposite to the symmetry axis C-C' and is a reference used at the time of adhering of the ACF. Similarly, for the terminal area 150A-2, the alignment mark 160, which is a reference used at the time of adhering of the ACF is also disposed outside of the end portion of the terminal area 150A-2 of the side opposite to the symmetry axis C-C'.

As illustrated in FIG. 1, in the first embodiment, the terminal group arranged in each of the terminal areas 150A-1 and 150A-2 includes six terminals, and the terminal group arranged in each of the terminal areas 150B-1 and 150B-2 includes seven terminals. Hereinafter, when there is a need to distinguish each terminal constituting the terminal group, each terminal is distinguished by being assigned T1, T2 . . . sequentially from a side close to the symmetry axis C-C' as illustrated in FIG. 1.

In the first embodiment, the terminal group arranged in the terminal area 150A-1 and the terminal group arranged in the terminal area 150A-2 have a signal arrangement in common. In detail, in each of the terminal areas 150A-1 and 150A-2, a control signal for controlling the scanning line driving circuit or the like is applied to the terminal T1 a low potential side power supply line voltage VSS is applied to the terminal T2, and a high potential side power supply line voltage VDD is applied to the terminal T3. A common potential LCCOM, which is a potential applied to, for example, the counter electrode, is applied to the terminals T4 and T5 in each of the terminal areas 150A-1 and 150A-2. The terminal T6 in each of the terminal areas 150A-1 and 150A-2 is a dummy terminal to which no electric signal is applied from the outside, and there is no wire extending from the terminal T6 toward the first area 10A. The roles of the terminals forming the terminal groups which are arranged in the terminal areas 150B-1 and 150B-2 are as follows. In each of the terminal areas 150B-1 and 150B-2, a control signal for controlling the scanning line driving circuit or the like or a video signal is applied to the terminal T1, another control signal is applied to the terminal T2, the low potential side power supply line voltage VSS is applied to the terminal T3, the high potential side power supply line voltage VDD is applied to the terminal T4, and the common potential LCCOM is applied to the terminals T5 and T6. The terminal T7 in each of the terminal areas 150B-1 and 150B-2 is a dummy terminal. Since the signal arrangement of the terminal groups is common, the same COF can be used to be adhered to the element substrate 10. Therefore, there is an advantage in cost due to the use of common parts.

In the first embodiment, the arrangement of wires from the terminal group arranged in the terminal area 150A-1 and the terminal group arranged in the terminal area 150A-2 to the first area 10A is as follows. A signal line through which the control signal is transmitted, that is, the wire from the terminal T1 to the first area 10A is illustrated by a solid line, and wires (power supply wires) from power supply terminals to which a predetermined potential is applied, that is, the terminals T2 to T5 to the first area 10A, are illustrated by oblique hatching. It should be noted that in FIG. 1 and FIGS. 2 to 6 to be described hereafter, a state in which wire extends to the end portion of the counter substrate 20 is extracted and illustrated conceptually. One of the features of the first embodiment is the arrangement of wires from the power supply terminal to the first area 10A.

As illustrated in FIG. 1, the power supply terminals arranged in the terminal area 150A-1 and the power supply terminals arranged in the terminal area 150A-2 which play the same role are connected to each other. The power supply wire from the terminal T2 and the power supply wire from the terminal T3 to the first area 10A extend from the terminals close to the first area 10A (i.e., terminals T2 and T3 arranged in the terminal area 150A-1) toward the first area 10A. Meanwhile, the power supply wires from the terminals T4 and T5 to the first area 10A extend from between the terminal area 150A-1 and the terminal area 150A-2 (that is, a space required for mounting the COF) and reaches the first area 10A through an area outside of the terminal area 150A-1 when viewed from the symmetry axis C-C', which is one of the features of the first embodiment. It should be noted that the reason for having a portion where the width of the wires from the terminals T4 and T5 to the first area 10A is thicker than that of the other wire from the terminal T2 (or the terminal T3) to the first area 10A is that the power supply wires (hereinafter, common power supply wires) connected to the common power supply require low resistance.

The terminal T6, which is a dummy terminal, is provided to ensure reliability of the electrical connection of the COF. In the first embodiment, since the signal arrangement of the terminal group arranged in the terminal area 150A-1 and the terminal group arranged in the terminal area 150A-2 is common, the terminal T6 arranged on an outermost side of the terminal area 150A-1 is also the dummy terminal.

Figure 10:
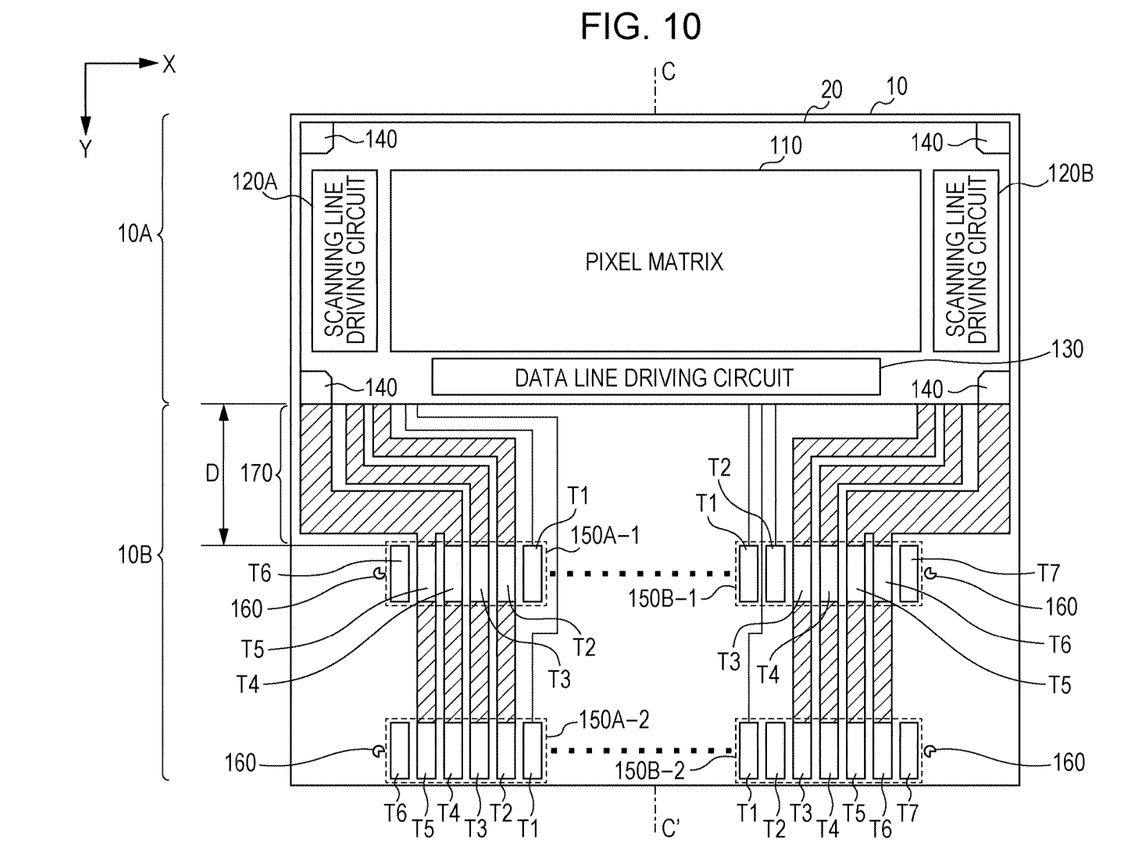
FIG. 10 is a plan view illustrating a configuration of an electro-optical panel according to the related art.

As described above, one of the features of the electro-optical panel 1000A according to the first embodiment is a wiring pattern of some of the wires from the terminal areas 150A-1 and 150A-2 to the first area 10A, that is, a wiring pattern of the common power supply wires. Prior to describing the effect obtained by adopting such a wiring pattern, a wiring pattern in the existing electro-optical panel will be described. FIG. 10 is a diagram illustrating a wiring pattern in the electro-optical panel according to the related art. In FIG. 10, the same components as those in FIG. 1 are denoted by the same reference numerals. As is apparent from a comparison between FIG. 10 and FIG. 1, in the electro-optical panel according to the related art, the common power supply wires also extend from terminals (terminals T4 and T5 arranged in the terminal area 150A-1) close to the first area 10A toward the first area 10A.

As is apparent from a comparison between FIG. 1 and FIG. 10, in the element substrate 10 according to the first embodiment, a width D of an area 170 in the Y direction is smaller than a width D of an area 170 in the electro-optical panel according to the related art illustrated in FIG. 10 to an extent of the common power supply wires not extending to the area 170 between the first area 10A and the first terminal area 150A-1. As described above, according to the first embodiment, the width D of the area 170 between the first area 10A and the terminal area 150A-1, which is a nearby terminal area in the Y direction when viewed from the first area 10A, can be reduced by extending the common power supply wires in the area between the terminal areas 150A-1 and 150B-1, which is required to mount the COF. It is possible to suppress an increase in the size of the electro-optical panel 1000A using the element substrate 10 as much as the width D of the area 170 can be small.

Second Embodiment

Figure 2:
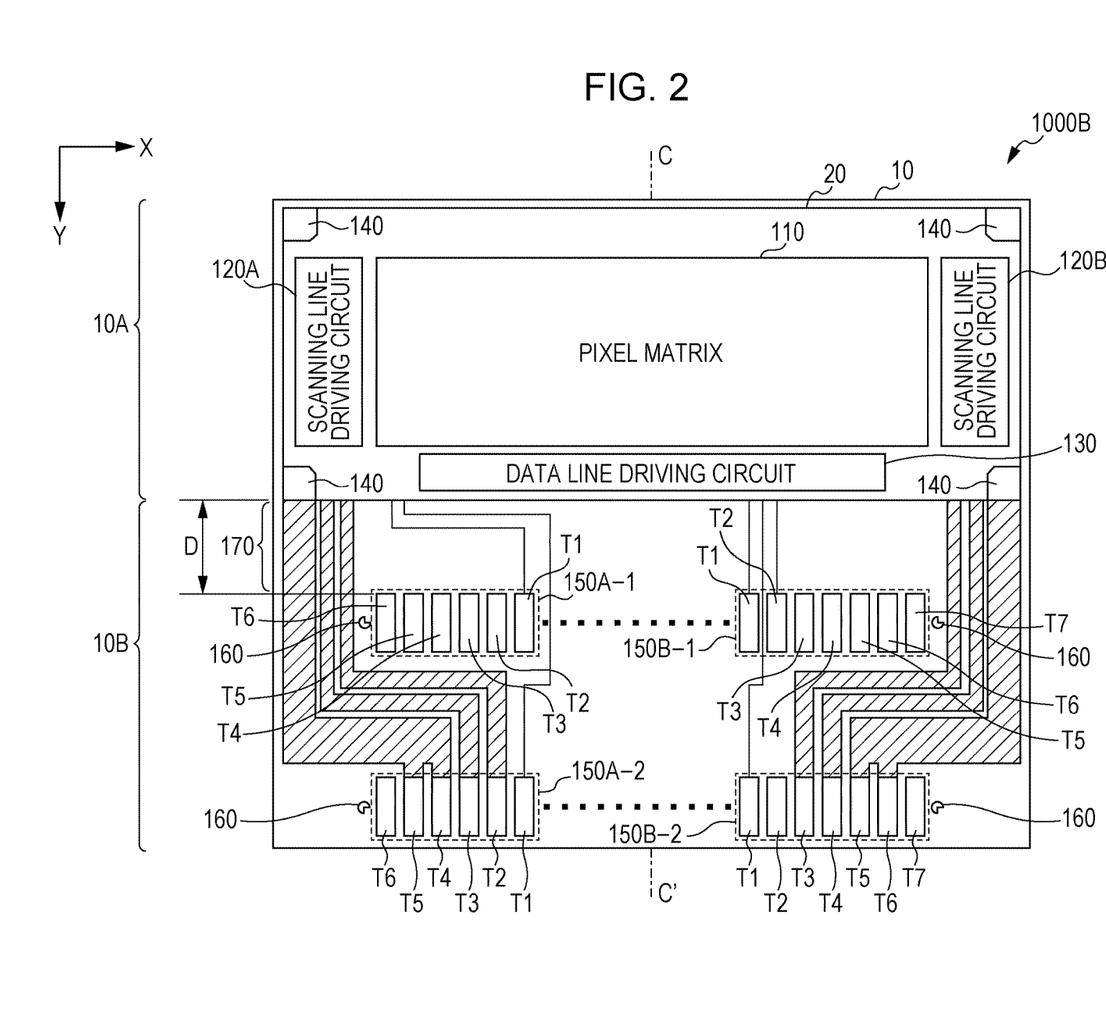
FIG. 2 is a plan view illustrating a configuration of an electro-optical panel according to a second embodiment of the invention.

FIG. 2 is a plan view of an electro-optical panel 1000B according to a second embodiment of the invention. In FIG. 2, the same components as those in FIG. 1 are denoted by the same reference numerals. As is apparent from a comparison between FIG. 2 and FIG. 1, the electro-optical panel 1000B according to the second embodiment is different from the electro-optical panel 1000A according to the first embodiment in that terminals T2 to T5 of six terminals arranged in the terminal area 150A-1 are dummy terminals and terminals T3 to T7 of seven terminals arranged in the terminal area 150B-1 are dummy terminals.

The roles of the terminal T1 arranged in the terminal area 150A-1 and the terminals T1 to T6 arranged in the terminal area 150A-2 are the same as those of the first embodiment. The roles of the terminals T1 and T2 arranged in the terminal area 150B-1 and the terminals T1 to T7 arranged in the terminal area 150A-2 are the same as those of the first embodiment. As illustrated in FIG. 2, according to the second embodiment, all the power supply wires which extend from the power supply terminals (that is, terminals T2 to T5) arranged in the terminal area 150A-2 and reach the first area 10A extend from between the terminal area 150A-1 and the terminal area 150A-2, irrespective of whether the power supply wires are common power supply wires, and reach the first area 10A through an area outside of the terminal area 150A-1.

With such a configuration, in the element substrate 10 according to the second embodiment, the width D of the area 170 can also be reduced as compared to the related art. Therefore, it is possible to suppress an increase in the size of the electro-optical panel 1000B using the element substrate 10.

Third Embodiment

Figure 3:
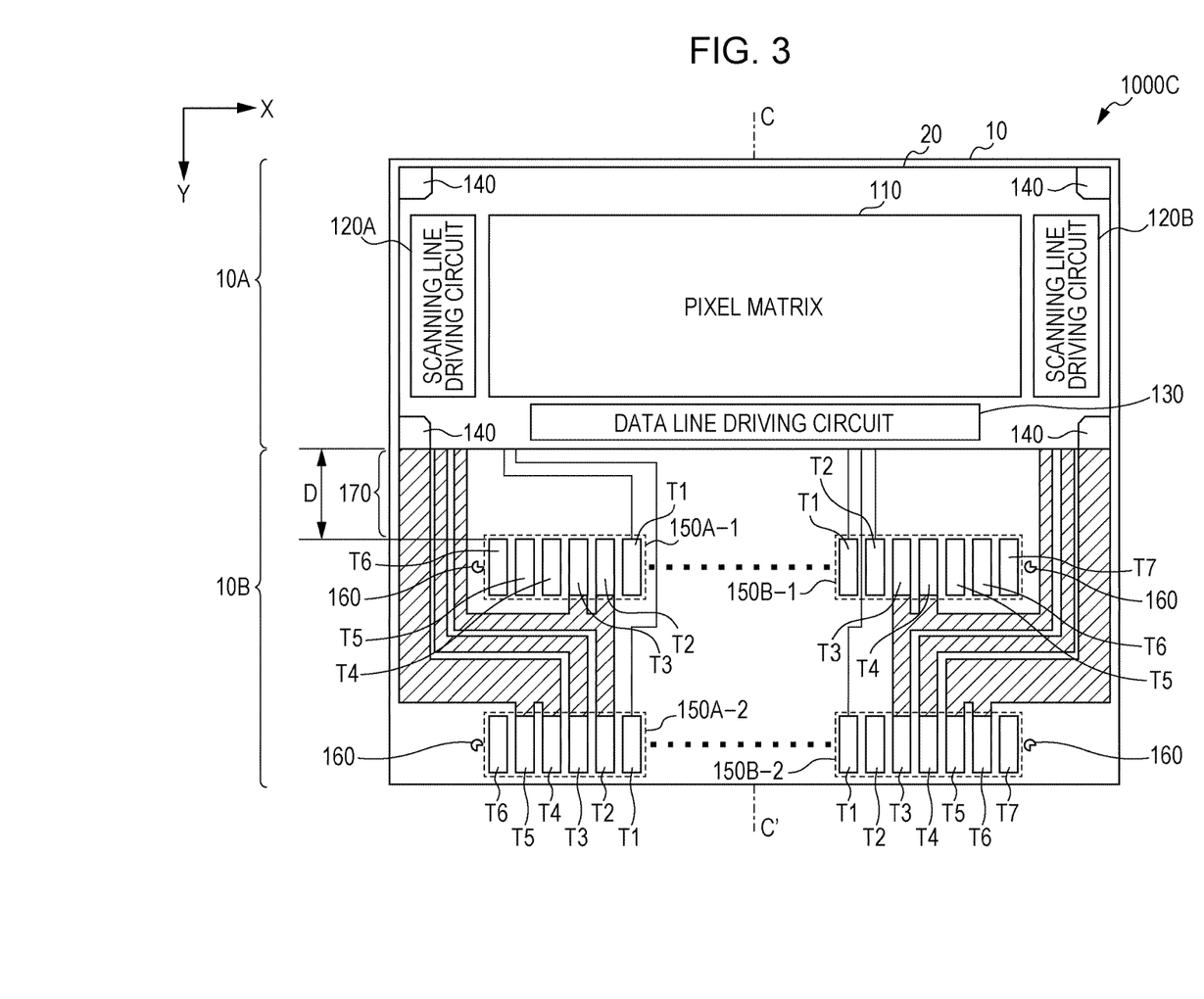
FIG. 3 is a plan view illustrating a configuration of an electro-optical panel according to a third embodiment of the invention.

FIG. 3 is a plan view of an electro-optical panel 1000C according to a third embodiment of the invention. In FIG. 3, the same components as those in FIG. 1 are denoted by the same reference numerals. The roles of the terminals T1, T2, and T6 in the terminal area 150A-1 and the roles of the terminals T1 to T6 in the terminal area 150A-2 of the third embodiment are the same as those of the first embodiment, whereas the roles of the terminals T3 to T5 in the terminal area 150A-1 are different from those of the first embodiment. Similarly, the roles of the terminals T1 to T3 and T7 in the terminal area 150B-1 and the roles of the terminals T1 to T7 in the terminal area 150B-2 are the same as those of the first embodiment, whereas the roles of the terminals T4 to T6 in the terminal area 150B-1 are different from those of the first embodiment.

More specifically, in the terminal area 150A-1, the low potential side power supply line voltage VSS is applied to the terminal T3, and the terminals T4 and T5 are dummy terminals. In addition, in the terminal area 150B-1, the low potential side power supply line voltage VSS is applied to the terminal T4, and the terminals T5 and T6 are dummy terminals. In other words, in the third embodiment, the signal arrangement of the terminal group arranged in the terminal area 150A-1 and the signal arrangement of the terminal group arranged in the terminal area 150A-2 are different from each other, and the signal arrangement of the terminal group arranged in the terminal area 150B-1 and the signal arrangement of the terminal group arranged in the terminal area 150B-2 are also different from each other.

In the third embodiment, the power supply terminals arranged in the terminal area 150A-1 and the power supply terminals arranged in the terminal area 150A-2 which play the same role are connected to each other. That is, the terminals T2 and T3 arranged in the terminal area 150A-1 and the terminal T2 arranged in the terminal area 150A-2 are connected to each other as illustrated in FIG. 3. In the third embodiment, the wires extending from the power supply terminals (i.e., terminals T2 and T3) arranged in the terminal area 150A-1 and the wires extending from the power supply terminals (i.e., terminals T2 to T5) arranged in the terminal area 150A-2 that reach the first area 10A extend from between the terminal area 150A-1 and the terminal area 150A-2 and reach the first area 10A through an area outside of the terminal area 150A-1 as illustrated in FIG. 3.

With such a configuration, in the element substrate 10 according to the third embodiment, the width D of the area 170 can also be reduced. Therefore, according to the third embodiment, it is possible to suppress an increase in the size of the electro-optical panel 1000C using the element substrate 10. In addition, according to the third embodiment, since an important power supply (in the third embodiment, low potential side power supply) among the respective power supplies is configured to be supplied from two terminal groups, even if a failure occurs in any one of the terminal groups, the supply of voltage from the power supply is not interrupted. As described above, according to the third embodiment, it is possible to accomplish the effect of enhancing the power supply which is important.

Fourth Embodiment

Figure 4:
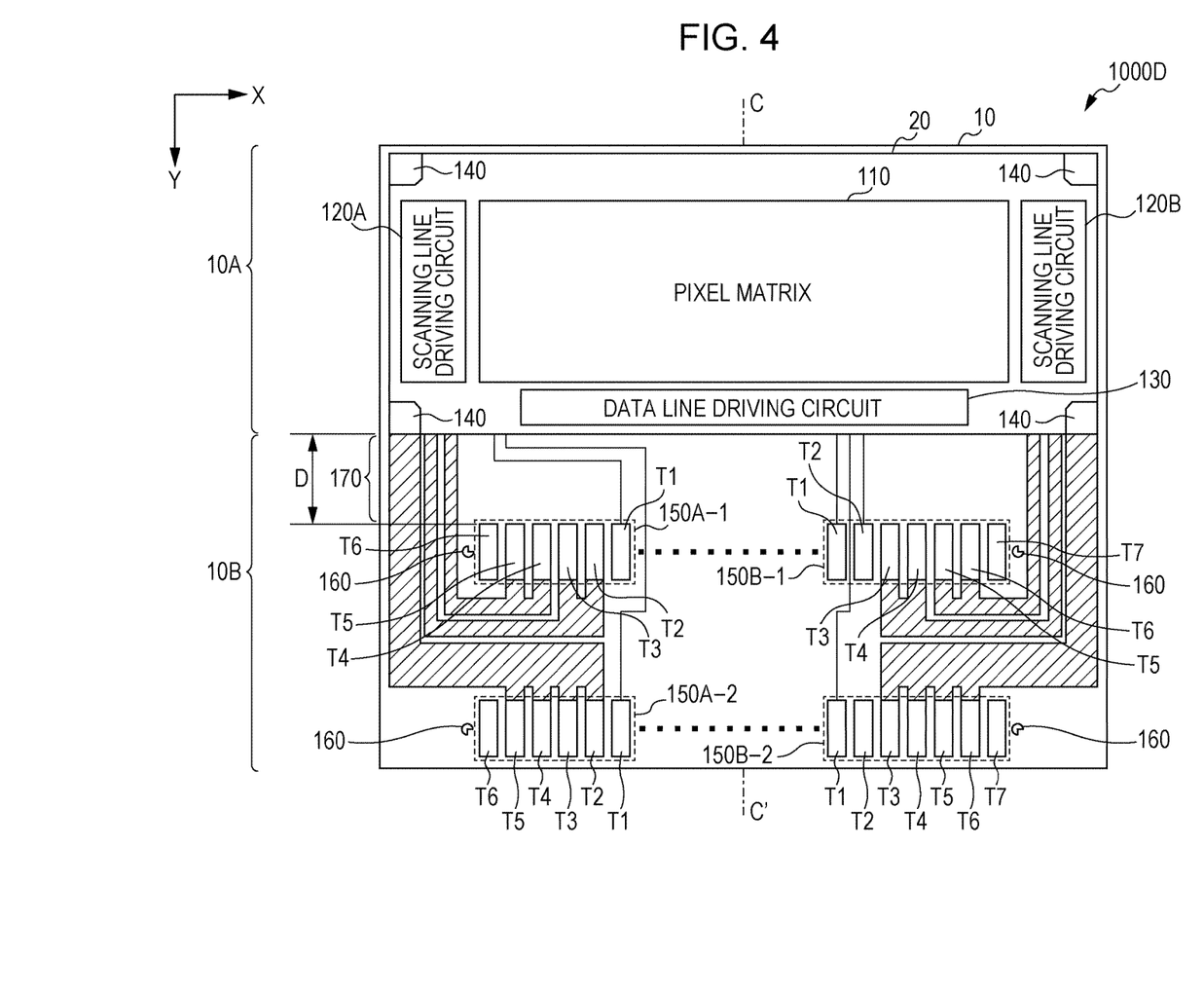
FIG. 4 is a plan view illustrating a configuration of an electro-optical panel according to a fourth embodiment of the invention.

FIG. 4 is a plan view of an electro-optical panel 1000D according to a fourth embodiment of the invention. In FIG. 4, the same components as those in FIG. 1 are denoted by the same reference numerals. In the fourth embodiment, the roles of the terminals T1, T2, and T6 in the terminal area 150A-1 and the roles of the terminals T1 and T4 to T6 in the terminal area 150A-2 are the same as those of the first embodiment. Similarly, the roles of the terminals T1, T2 and T7 in the terminal area 150B-1 and the roles of the terminals T1, T2, and T5 to T7 in the terminal area 150B-2 are the same as those of the first embodiment. However, the roles of the terminals T3 to T5 in the terminal area 150A-1 are different from those of the first embodiment, and the roles of the terminals T2 and T4 in the terminal area 150A-2 are also different from those of the first embodiment. Similarly, the roles of the terminals T3 to T6 in the terminal area 150B-1 are different from those of the first embodiment, and the roles of the terminals T3 and T4 in the terminal area 150B-2 are also different from those of the first embodiment.

More specifically, in the terminal area 150A-1, the low potential side power supply line voltage VSS is applied to the terminals T2 and T3, and the high potential side power supply line voltage VDD is applied to the terminals T4 and T5. In contrast, the common power supply voltage LCCOM is applied to the terminals T2 to T5 in the terminal area 150A-2. In other words, in the fourth embodiment, the signal arrangement of the terminal group arranged in the terminal area 150A-1 and the signal arrangement of the terminal group arranged in the terminal area 150A-2 are different from each other. Among these power supply terminals, the number of common power supply terminals to which the common potential is applied is more than the number of power supply terminals to which another potential is applied. In other words, among the power supply terminals, the number of common power supply terminals is the highest. Similarly, the signal arrangement of the terminal group arranged in the terminal area 150B-1 and the signal arrangement of the terminal group arranged in the terminal area 150B-2 are also different from each other. Specifically, in the terminal area 150B-1, the low potential side power supply line voltage VSS is applied to the terminals T3 and T4, and the high potential side power supply line voltage VDD is applied to the terminals T5 and T6. In contrast, the common power supply voltage LCCOM is applied to the terminals T3 to T6 in the terminal area 150B-2.

In the fourth embodiment, the power supply terminals arranged in the terminal area 150A-1 and the power supply terminals arranged in the terminal area 150A-2 which play the same role are connected to each other. In other words, in the terminal area 150A-1, the terminals T2 and T3 are connected to each other, and the terminals T4 and T5 are connected to each other. In addition, the terminals T2 to T5 arranged in the terminal area 150A-2 are also connected to each other. In the fourth embodiment, the wires extending from the power supply terminals (i.e., terminals T2 to T5) arranged in the terminal area 150A-1 and the wires extending from the power supply terminals (i.e., terminals T2 to T5) arranged in the terminal area 150A-2 that reach the first area 10A extend from between the terminal area 150A-1 and the terminal area 150A-2 and reach the first area 10A through an area outside of the terminal area 150A-1 as illustrated in FIG. 4.

With such a configuration, in the element substrate 10 according to the fourth embodiment, the width D of the area 170 can also be reduced. As a result, according to the fourth embodiment, it is possible to suppress an increase in the size of the electro-optical panel 1000D using the element substrate 10. In addition, according to the fourth embodiment, it is possible to enhance other power supplies while most enhancing the common power supply and avoid the unnecessary intersection of the respective power supply wires.

Fifth Embodiment

Figure 5:
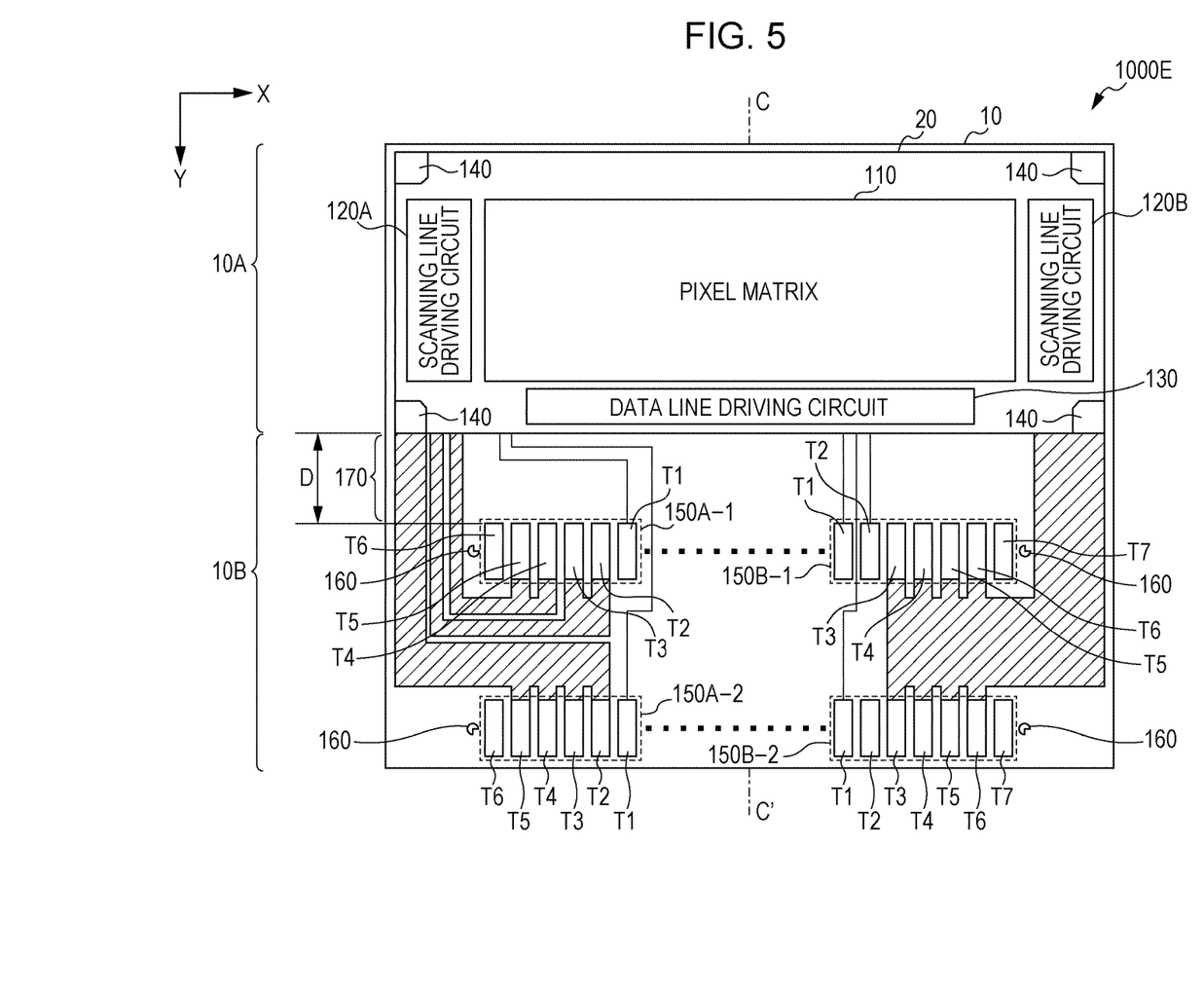
FIG. 5 is a plan view illustrating a configuration of an electro-optical panel according to a fifth embodiment of the invention.

FIG. 5 is a plan view of an electro-optical panel 1000E according to a fifth embodiment of the invention. In FIG. 5, the same components as those in FIG. 1 are denoted by the same reference numerals. In the fifth embodiment, the roles of the respective terminals arranged in the terminal area 150A-1 and the terminal area 150A-2 are the same as the roles of the respective terminals arranged in the terminal area 150A-1 and the terminal area 150A-2 in the fourth embodiment. In contrast, the roles of the respective terminals arranged in the terminal areas 150B-1 and 150B-2 are different from the roles thereof in any of the first to fourth embodiments. More specifically, among the terminals T1 to T7 arranged in the terminal area 150B-1, a control signal is applied to the terminal T1, a control signal (or video signal) different from the above control signal is applied to the terminal T2, the common power supply voltage LCCOM is applied to each of the terminals T3 to T6, and the terminal T7 is a dummy terminal. Meanwhile, among the terminals arranged in the terminal area 150B-2, a control signal is applied to the terminal T1, another control signal is applied to the terminal T2 or the terminal T2 is a dummy terminal, and the common power supply voltage LCCOM is applied to each of the terminals T3 to T6.

In the fifth embodiment, the power supply terminals arranged in the terminal area 150B-1 and the power supply terminals arranged in the terminal area 150B-2 which play the same role are connected to each other. In other words, the terminals T3 to T6 arranged in the terminal area 150B-1 and the terminals T3 to T6 arranged in the terminal area 150B-2 are connected to each other. In the fifth embodiment, the wires extending from the power supply terminals arranged in the terminal area 150B-1 and the wires extending from the power supply terminals arranged in the terminal area 150B-2 that reach the first area 10A extend from between the terminal area 150B-1 and the terminal area 150B-2 and reach the first area 10A through an area outside of the terminal area 150B-1 as illustrated in FIG. 5.

With such a configuration, in the element substrate 10 according to the fifth embodiment, the width D of the area 170 can also be reduced. Therefore, according to the fifth embodiment, it is possible to suppress an increase in the size of the electro-optical panel 1000E using the element substrate 10.

Sixth Embodiment

Figure 6:
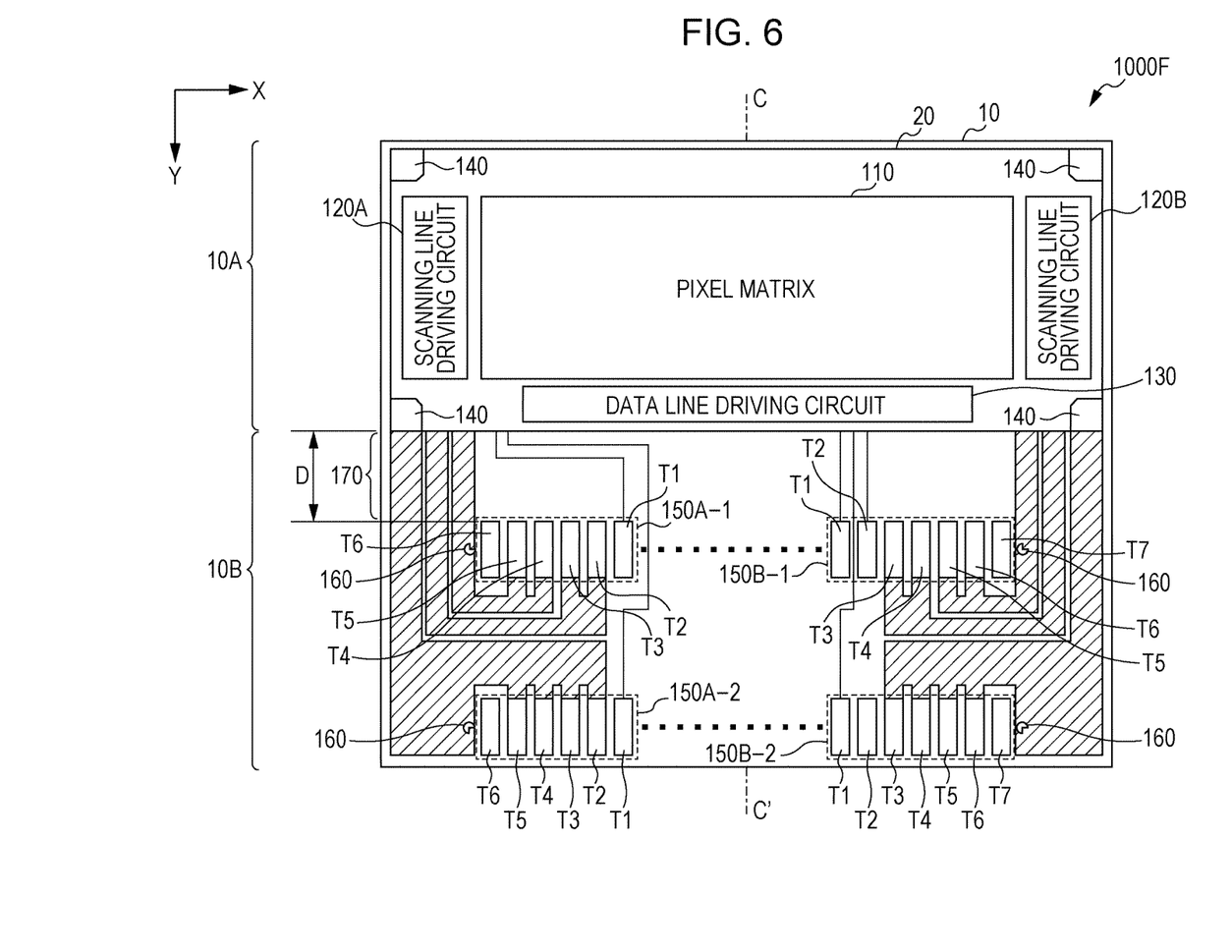
FIG. 6 is a plan view illustrating a configuration of an electro-optical panel according to a sixth embodiment of the invention.

FIG. 6 is a plan view of an electro-optical panel 1000F according to a sixth embodiment of the invention. In FIG. 6, the same components as those in FIG. 1 are denoted by the same reference numerals. The roles of the respective terminals in the electro-optical panel 1000F are the same as those in the fourth embodiment. As apparent from a comparison between FIG. 6 and FIG. 4, the arrangement of wires in the sixth embodiment is basically the same as the arrangement of wires in the fourth embodiment.

Therefore, according to the sixth embodiment, the same effect as that of the fourth embodiment can be accomplished. In other words, the width D of the area 170 can be reduced as compared to the related art. Therefore, it is possible to suppress an increase in the size of the electro-optical device using the electro-optical panel 1000F and enhance other power supplies while most enhancing the common power supply.

In addition, one of the features of the sixth embodiment is to increase the width of each wire so that a margin in an area outside of the terminal area 150A-1 and the terminal area 150A-2 and an area outside of the terminal area 150B-1 and the terminal area 150B-2 becomes as narrow as possible, and in particular, to increase the width of each wire so that the width of the common power supply wires is widest. This is to reduce the resistance of the power supply wires as much as possible. In addition, a feature of the sixth embodiment is that the alignment mark 160 is realized by the outlined pattern in the wiring layer. The feature is that the width of the power supply wires is as large as possible.

With such a configuration, it is possible to accomplish the effects of: suppressing an increase in the size of the electro-optical panel 1000F using the element substrate 10 of the sixth embodiment, enhancing other power supplies while most enhancing the common power supply, and making the electrical resistance of the power supply wires smaller than that of the fourth embodiment.

MODIFIED EXAMPLES

The invention is not limited to the foregoing embodiments, and for example, various modifications as described below are possible. In addition, one or a plurality of modified forms to be described below, which are selected as desired, may be appropriately combined.

(1) In each of the embodiments described above, an example of the invention applied to the arrangement of the power supply wires is described. However, signal lines other than the power supply wires may be configured to be the wires extending from between the terminal area 150A-1 and the terminal area 150A-2 and reach the first area 10A through an area outside of the terminal area 150A-1.

(2) In each of the embodiments described above, a case in which six terminals are arranged in each of the terminal area 150A-1 and the terminal area 150A-2 is described. However, the number of terminals arranged in the terminal area 150A-1 and the terminal area 150A-2, respectively, may be less than or equal to five or more than or equal to seven. Likewise, the number of terminals arranged in the terminal area 150B-1 and the terminal area 150B-2, respectively, may be less than or equal to six or more than or equal to eight.

(3) In each of the embodiments described above, the case in which two terminal areas (for example, the terminal area 150A-1 and the terminal area 150A-2) are arranged in the Y direction when viewed from the first area 10A is described. However, more than or equal to three terminal areas may be arranged.

Application Examples

Figure 7:
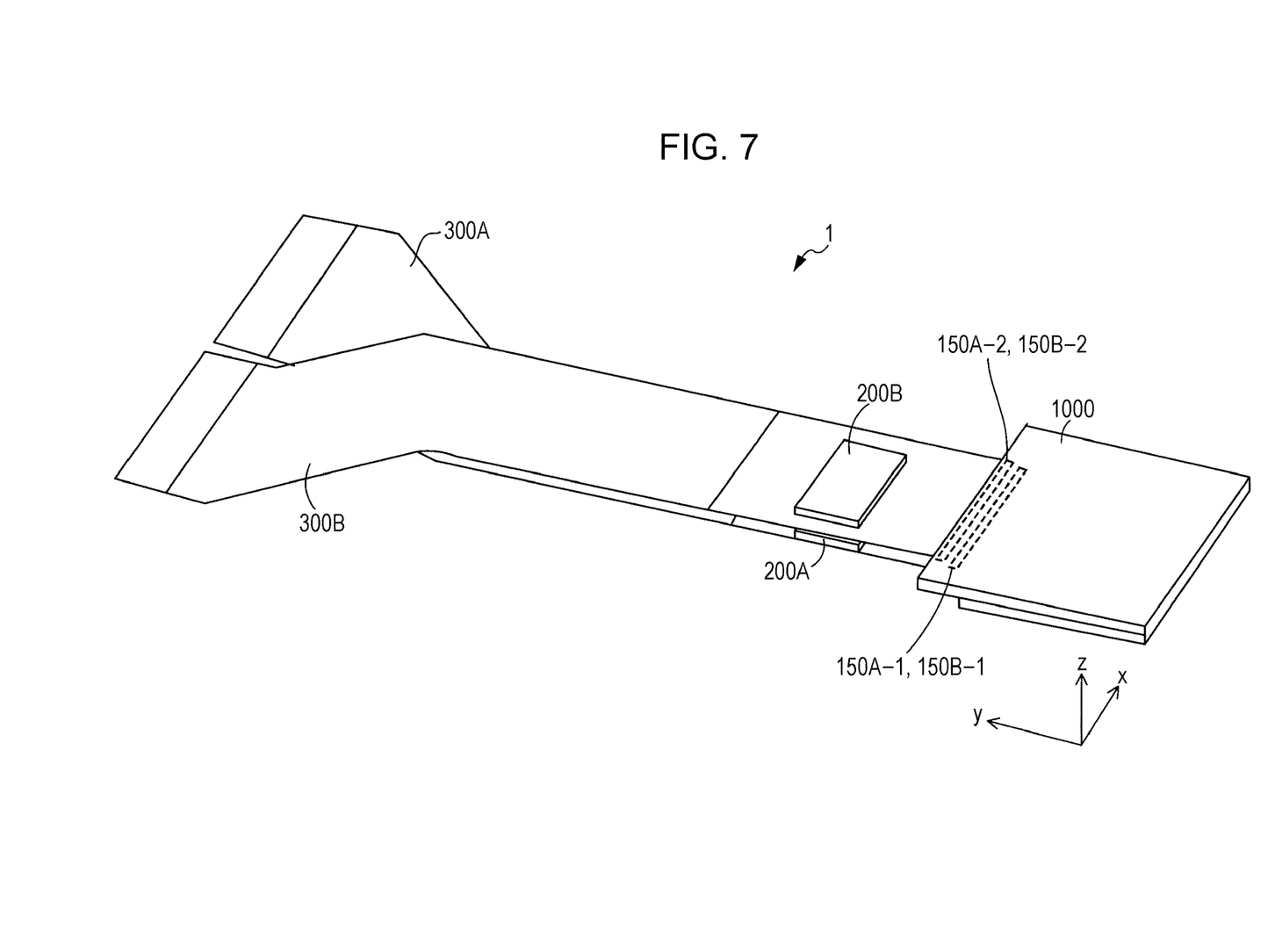
FIG. 7 is a perspective view illustrating a configuration of an electro-optical device of the invention.

FIG. 7 is a diagram illustrating a configuration example of the electro-optical device 1 including one of the electro-optical panels 1000A to 1000F (hereinafter, collectively referred to as "electro-optical panel 1000") according to the first to sixth embodiments described above. The electro-optical device 1 has a configuration in which a COF 300A and a COF 300B are connected to the first terminal areas 150A-1 and 150B-1 and the second terminal areas 150A-2 and 150B-2 of the electro-optical panel 1000, respectively. ICs 200A and 200B for driving are mounted on the COF 300A and the COF 300B, respectively. The electro-optical device 1 can be driven by both of the ICs 200A and 200B for driving under control of a host circuit and can perform a high-resolution display. For example, the number of pixels of the electro-optical device 1 may be 3840×2160 or more by doubling the number of widthwise and heightwise pixels of a full high-definition (HD) display.

Figure 8:
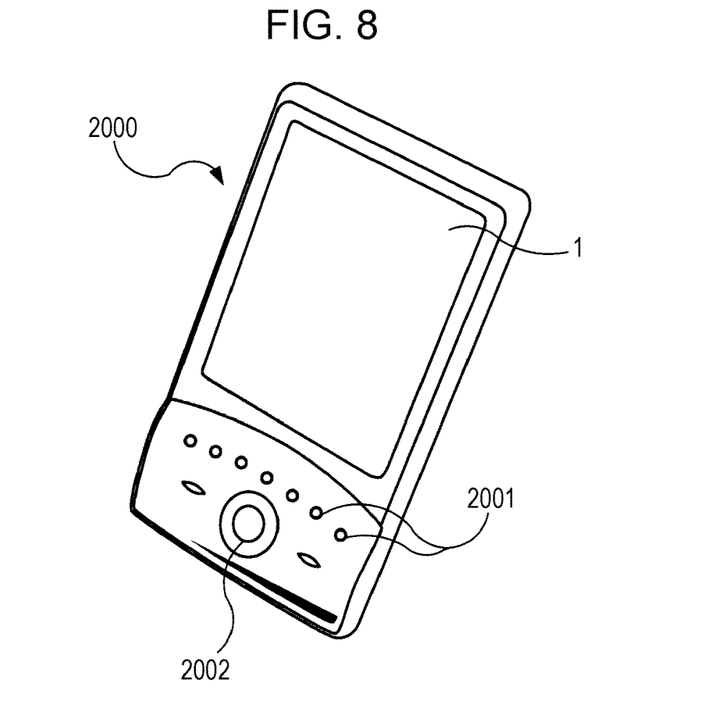
FIG. 8 is a perspective view illustrating a configuration of a personal digital assistant (PDA) to which the electro-optical device is applied.

FIG. 8 is a diagram illustrating a configuration example of a personal digital assistant (PDA) which is an electronic apparatus to which the electro-optical device 1 is applied. A personal digital assistant 2000 includes a plurality of operation buttons 2001, a power supply switch 2002, and the electro-optical device 1 as a display unit. If the power supply switch 2002 is operated, various types of information, such as an address book or a schedule book, is displayed on the electro-optical device 1.

Figure 9:
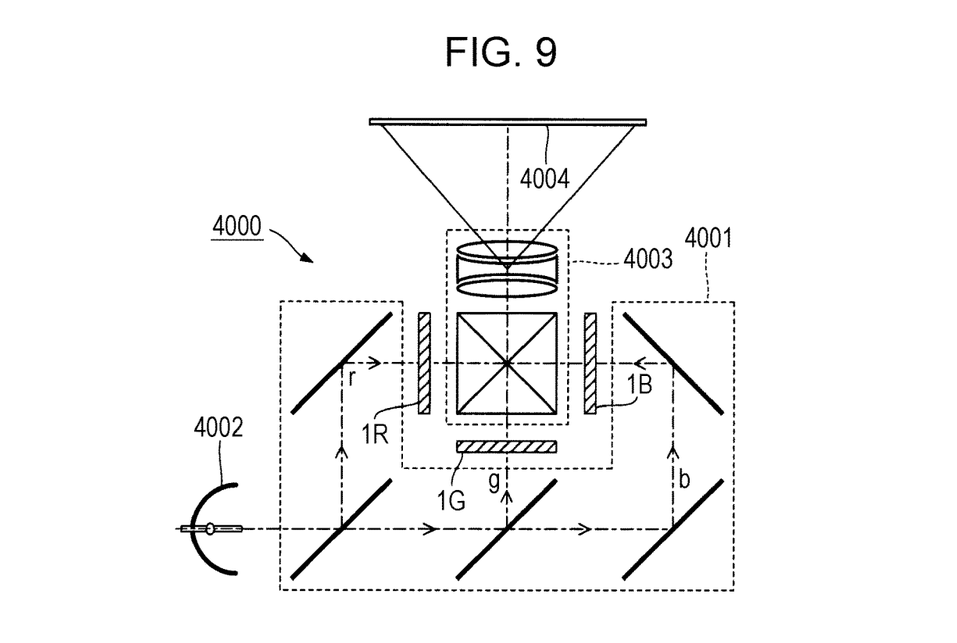
FIG. 9 is a view illustrating a configuration of a projection-type display device to which the electro-optical device is applied.

FIG. 9 is a schematic diagram of a projection-type display device (three-panel type projector) 4000 which is an electronic apparatus to which the electro-optical device 1 described above is applied. The projection-type display device 4000 is configured to include three electro-optical devices 1 (1R, 1G, and 1B) corresponding to different display colors (red, green, and blue). An illumination optical system 4001 supplies a red component r of light emitted from an illumination device (light source) 4002 to the electro-optical device 1R, a green component g to the electro-optical device 1G, and a blue component b to the electro-optical device 1B. Each electro-optical device 1 serves as an optical modulator (light valve) which modulates each monochromatic light component supplied from the illumination optical system 4001 in accordance with a display image. A projection optical system 4003 combines the rays of light emitted from each electro-optical device 1 and projects the composite light onto a projection surface 4004. It is possible to easily realize a projection-type display device 4000 which is small in size and capable of performing a high-resolution display by applying the above-described electro-optical device 1.

It should be noted that examples of the electronic apparatus to which the electro-optical device 1 is applied include a digital still camera, a liquid crystal television, a viewfinder-type or a monitor direct viewing-type video tape recorder, a car navigation device, a pager, an electronic organizer, a calculator, a word processor, a workstation, a video phone, a POS terminal, a device with a touch panel, or the like, in addition to those illustrated in FIGS. 8 and 9. The electro-optical device described above can be applied as a display unit to these various electronic apparatuses.

The entire disclosure of Japanese Patent Application No. 2017-019299, filed Feb. 6, 2017 is expressly incorporated by reference herein.

What is claimed is:

1. An electro-optical panel, comprising:
a circuit area in which a circuit is formed; and
a first terminal area and a second terminal area that are arranged side-by-side in a first direction viewed from the circuit area, wherein
the first terminal area and the second terminal area are each provided with a terminal group including a plurality of terminals which are arranged in a second direction different from the first direction, and
at least one of wires from the first terminal area to the circuit area and from the second terminal area to the circuit area extends from between the first terminal area and the second terminal area and reaches the circuit area through an area outside of the first terminal area viewed from a central axis of the electro-optical panel extending in the first direction.

2. The electro-optical panel according to claim 1, wherein the terminal group arranged in the first terminal area and the terminal group arranged in the second terminal area have a common signal arrangement.

3. The electro-optical panel according to claim 1, wherein the terminal group arranged in the first terminal area and the terminal group arranged in the second terminal area have different signal arrangements.

4. The electro-optical panel according to claim 1, wherein the at least one of wires extending from between the first terminal area and the second terminal area is connected to both of a terminal arranged in the first terminal area and a terminal arranged in the second terminal area.

5. The electro-optical panel according to claim 3, wherein the at least one of wires extending from between the first terminal area and the second terminal area is connected to any one of a terminal arranged in the first terminal area and a terminal arranged in the second terminal area.

6. The electro-optical panel according to claim 1, wherein the terminal group arranged in the first terminal area and the terminal group arranged in the second terminal area include a power supply terminal to which a predetermined potential is applied,
the at least one of wires extending from between the first terminal area and the second terminal area is a power supply wire which is connected to the power supply terminal,
among power supply terminals included in the terminal group arranged in the first terminal area and the terminal group arranged in the second terminal area, a number of common power supply terminals to which a common potential is applied is larger than a number of power supply terminals to which another potential is applied.

7. The electro-optical panel according to claim 6, wherein a common power supply wire connected to a common power supply terminal has a portion having a wire width larger than another power supply wire connected to another power supply terminal.

8. An electro-optical device using the electro-optical panel according to claim 1.

9. An electro-optical device using the electro-optical panel according to claim 2.

10. An electro-optical device using the electro-optical panel according to claim 3.

11. An electro-optical device using the electro-optical panel according to claim 4.

12. An electro-optical device using the electro-optical panel according to claim 5.

13. An electro-optical device using the electro-optical panel according to claim 6.

14. An electro-optical device using the electro-optical panel according to claim 7.

15. An electronic apparatus using the electro-optical device according to claim 8.

16. An electro-optical panel, comprising:
a driving circuit in a circuit area;
a first terminal in a first terminal area, the first terminal area being arranged outside of the circuit area;
a second terminal in a second terminal area, the first terminal area being arranged between the circuit area and the second terminal area in a first direction viewed from the circuit area;
a plurality of terminals which are arranged in the first terminal area in a second direction different from the first direction; and
a wire from the second terminal which is connected to the driving circuit through an area outside of the first terminal area in the first direction.

17. The electro-optical panel according to claim 16, further comprising:
a wire from the first terminal which is extend from between the first terminal area and the second terminal area and is connected to the driving circuit through an area outside of the first terminal area in the first direction.

18. The electro-optical panel according to claim 16, wherein,
the wire from the second terminal is connected to a common power supply terminal and is thicker than that of the other wire from the first terminal.

* * * * *